United States Patent
Morovic et al.

(10) Patent No.: US 10,528,033 B2
(45) Date of Patent: *Jan. 7, 2020

(54) STRUCTURE FORMING FOR A THREE-DIMENSIONAL OBJECT

(71) Applicant: HEWLETT-PACKARD DEVELOPMENT COMPANY, L.P., Houston, TX (US)

(72) Inventors: Jan Morovic, Colchester (GB); Peter Morovic, Sant Cugat del Valles (ES); Juan Manuel Garcia-Reyero Vinas, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 152 days.

This patent is subject to a terminal disclaimer.

(21) Appl. No.: 15/544,638

(22) PCT Filed: Apr. 1, 2015

(86) PCT No.: PCT/EP2015/057271
§ 371 (c)(1),
(2) Date: Jul. 19, 2017

(87) PCT Pub. No.: WO2016/155829
PCT Pub. Date: Oct. 6, 2016

(65) Prior Publication Data
US 2018/0011476 A1    Jan. 11, 2018

(51) Int. Cl.
*G06F 19/00* (2018.01)
*G05B 19/4099* (2006.01)
(Continued)

(52) U.S. Cl.
CPC ........ *G05B 19/4099* (2013.01); *B29C 64/386* (2017.08); *B33Y 50/00* (2014.12); *G05B 2219/49019* (2013.01)

(58) Field of Classification Search
CPC ............ B33Y 50/00; G06F 17/50; H04N 1/45
(Continued)

(56) References Cited

U.S. PATENT DOCUMENTS

| 7,364,686 B2 | 4/2008 | Kritchman et al. |
| 8,142,860 B2 | 3/2012 | Vanmaele et al. |

(Continued)

FOREIGN PATENT DOCUMENTS

CN    102950770    3/2013

OTHER PUBLICATIONS

Cho, et al.; "A Dithering Algorithm for Local Composition Control With Three-Dimensional Printing"; Aug. 1, 2003; Computer Aided Design, Elsevier Publishers; vol. 35; No. 9; pp. 851-867.
(Continued)

*Primary Examiner* — Md Azad
(74) *Attorney, Agent, or Firm* — HP Inc. Patent Department

(57) ABSTRACT

Certain examples described herein relate to structure forming for the production of a three-dimensional object. In these examples, different structure forming components or functions are applied to volumes of a three-dimensional object. These structure forming components or functions are arranged to differentially generate a halftone output. The halftone output is generated by processing a material volume coverage representation for the three-dimensional object. The halftone output is used to provide control data for instructing production of a three-dimensional object.

20 Claims, 3 Drawing Sheets

(51) Int. Cl.
*B33Y 50/00* (2015.01)
*B29C 64/386* (2017.01)

(58) Field of Classification Search
USPC .......................................................... 700/118
See application file for complete search history.

(56) References Cited

U.S. PATENT DOCUMENTS

| | | | | |
|---|---|---|---|---|
| 8,995,022 | B1* | 3/2015 | Vronsky | H01L 51/0005 358/3.06 |
| 2010/0125356 | A1* | 5/2010 | Shkolnik | G06T 1/00 700/98 |
| 2014/0265034 | A1 | 9/2014 | Dudley | |
| 2014/0324204 | A1 | 10/2014 | Vidimce et al. | |
| 2015/0298153 | A1* | 10/2015 | Baker | B05B 12/12 438/7 |
| 2016/0101570 | A1* | 4/2016 | Iorio | G05B 19/4099 700/98 |
| 2016/0167306 | A1* | 6/2016 | Vidimce | B29C 67/0088 264/40.1 |
| 2019/0030816 | A1* | 1/2019 | Iorio | B29C 64/386 |

OTHER PUBLICATIONS

Siu, et al; "Modeling the Material Grading and Structures of Heterogeneous Objects for Layered Manufacturing'" Computer Aided Design, Elsevier Publishers; Sep. 1, 2002; vol. 34, No. 10; pp. 705-716.

Vidimce; "OpenFab: A Programmable Pipeline for Multi-Material Fabrication"; 2013; Massachusetts Institute of Technology; http://cfg.mit.edu/content/openfab-programmable-pipeline-multi-material-fabrication.

* cited by examiner

STRUCTURE FORMING FOR A THREE-DIMENSIONAL OBJECT

BACKGROUND

Apparatus that generate three-dimensional objects, including those commonly referred to as "3D printers", have been proposed as a potentially convenient way to produce three-dimensional objects. These apparatus may receive a definition of the three-dimensional object in the form of an object model. This object model is processed to instruct the apparatus to produce the object using one or more material components. This may be performed on a layer-by-layer basis. It may be desired to produce a three-dimensional object with one or more properties, such as color, mechanical and/or structural properties. The processing of the object model may vary based on the type of apparatus and/or the production technology being implemented.

BRIEF DESCRIPTION OF THE DRAWINGS

Various features of the present disclosure will be apparent from the detailed description which follows, taken in conjunction with the accompanying drawings, which together illustrate, by way of example, features of the present disclosure, and wherein.

DETAILED DESCRIPTION

In the production of three-dimensional objects, e.g. in so-called "3D printing", there is a challenge to produce objects with a large variety of object properties. For example, it may be desired to produce objects with a variety, e.g. selectable and variable characteristics, of one or more of the following specified properties: material properties, mechanical properties, color, detail, flexibility, roughness, conductivity, and magnetism. There is also a desire to flexibly and efficiently produce such variation. For example, it may be desired to vary properties based on a common object model and/or modify production parameters to provide for iterative improvements in a generated output. For example, it may be desired to produce a first version of an object with a first selected set of property values and then following testing and/or examination produce a second version of the same object with a different second selected set of property values, wherein the second selected set of property values comprise modified versions of the first selected set of property values based on the results of testing and/or examination.

Certain examples described herein enable the material composition used for forming the objects and the spatial structure into which the constituent materials are arranged to be decoupled. This then allows variation in both aspects to be independently specified. This is achieved by defining material composition in the form of a material volume coverage representation and by allowing for different structure forming components to be applied to different parts or portions of a three-dimensional object. A material volume coverage representation represents a probabilistic distribution of materials available to the apparatus for production of the three-dimensional object. It may be defined in the form of one or more material volume coverage vectors, wherein each vector represents a proportional volumetric coverage of materials available for production of the three-dimensional object and combinations of said materials. Each structure forming component is configured to process at least a portion of the material volume coverage representation to generate a three-dimensional halftone output. The output of a plurality of structure forming components may be combined to generate control data comprising production instructions for discrete arrangement of said materials available for production of the three-dimensional object. The production instructions may comprise instructions for arranging a particular unit of material in three-dimensional space. In one case, the production instructions may comprise deposit instructions, e.g. of material or of an agent onto a material substrate. The deposit instructions may be defined in relation to a slice or z-plane of the three-dimensional object.

Figure 1:
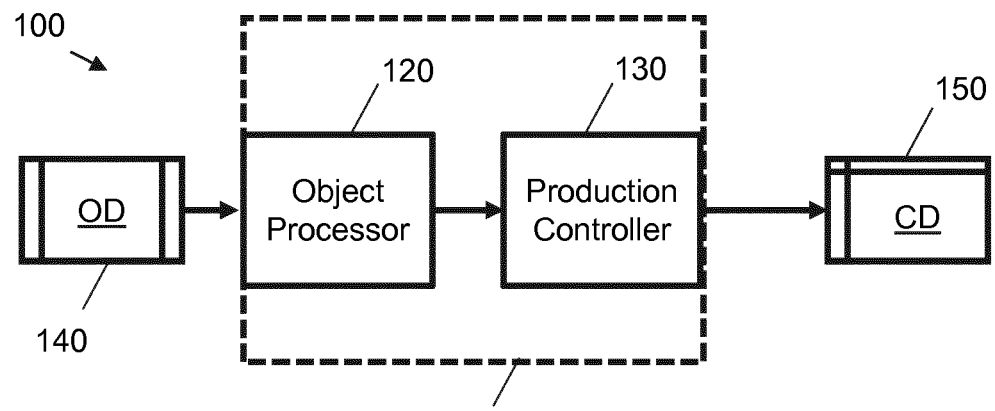
FIG. 1 is a schematic diagram showing an apparatus for generating control data for production of a three-dimensional object using a material volume coverage representation according to an example.

FIG. 1 shows schematically an example 100 of an apparatus 110 for generating control data for the production of a three-dimensional object. In certain cases, the apparatus 110 may form part of a stand-alone additive manufacturing apparatus; in other cases, the apparatus 110 may supply control data to an additive manufacturing apparatus to enable an object to be produced. The apparatus 110 comprises an object processor 120 and a production controller 130. The object processor 120 is arranged to obtain an object definition 140. The object definition 140 comprises electronic data defining an object to be produced.

In the present example 100, the object processor 120 is configured to obtain a material volume coverage representation and an indication of structure for the three-dimensional object. The material volume coverage representation comprises at least one material volume coverage vector for at least one volume of the three-dimensional object. Each material volume coverage vector represents a proportional volumetric coverage of materials available for production of the three-dimensional object and combinations of said materials. The indication of structure indicates a structure for the at least one volume. In certain cases, the material volume coverage representation may comprise a plurality of material volume coverage vectors for a respective plurality of defined volumes, e.g. for defined volume elements or voxels. Similarly the indication of structure may comprise a plurality of structure values, each structure value being associated with a respective one of the plurality of defined volumes or volume elements. In one case, the material volume coverage representation and the indication of structure may be defined in associated with a common resolution, e.g. may be defined in relation to a set of voxels containing the three-dimensional object to be produced. In other cases, the material volume coverage representation and the indication of structure may be defined for the three-dimensional object based on different sets of volumes or volume elements, e.g. an object definition for a cube may comprise a rasterized set of 27 voxels (e.g. 3×3×3) while having two indications of structure (e.g. one for each of two tetrahedra that divide the cube). The materials and material combinations defined by the material volume coverage vector may be associated with a number of different material types, e.g. build materials, finishing materials, support or scaffolding materials, agents and powders and printing fluids (including inks, varnishes and glosses), including separate use of materials, joint use of materials, and an absence of any materials.

In one case, the object processor 120 may be configured to receive an object definition that directly comprises material volume coverage vectors and indications of structure, e.g. in relation to a given object and/or its constituent parts. In another case, the object processor 120 may be configured to receive an object definition that comprises at least one object property value for an object and/or its constituent parts. This latter case is described in more detail with reference to FIG. 3. In this latter case, material volume coverage vectors and indications of structure may be derived by the object processor 120 based on a function of received object property values.

In FIG. 1, the production controller 130 is communicatively coupled to the object processor 120 and is arranged to use the material volume coverage representation and the indication of structure to generate control data 150 for production of the three-dimensional object. The control data 150 comprises production instructions for discrete arrangement of the materials available for production of the three-dimensional object at a production resolution. To generate the control data 150, the production controller 130 is configured to perform a number of operations. From the indication of structure for a defined volume, the production controller 130 selects a structure forming component from a plurality of available structure forming components for the volume based on a value for the indication of structure. Each structure forming component is configured to process at least a portion of the material volume coverage representation to generate a three-dimensional halftone output. The production controller 130 applies the selected structure forming component to the material volume representation and uses the output of this operation to construct the control data 150.

In one case, the material volume coverage representation comprises material volume coverage vectors for at least volumes forming part of a raster representation of the three-dimensional object. As such, each material volume coverage vector may be associated with a series of unit volumes referred to herein as "voxels", in a similar manner to the way in which a two-dimensional image is divided into unit areas referred to as "pixels". In one case, cubic volumes may be used with a common value for each of the height, width and depth of a voxel. In other cases, custom unit volumes or voxels may be defined, e.g. where the unit volume is non-cubic and/or has values of height, width and depth that differ from each other with (although each voxel has the same height, width and depth as other voxels in the raster representation). In certain cases, the unit volume or voxel may be a non-standard or custom-defined three-dimensional shape, e.g. voxels may be based on Delaunay tessellations (e.g. tetrahedra that fill the object) or any other space-filling polyhedra. In this case, the material volume coverage representation may be stored as a set of tuples (e.g. in an array-type structure) with one component of the tuple representing a voxel co-ordinate in three dimensions (e.g. a centroid or bottom corner) and another component of the tuple representing a material volume coverage vector.

To explain the components of a material volume coverage vector, a simple example may be considered. In this simple example, an apparatus is arranged to use two materials to generate a three-dimensional object: M1 and M2. These may be fluid build materials that are deposited on a substrate or platen, e.g. excreted or ejected molten polymers, or they may comprise two deposit-able colored agents that are deposited on one or more layers of powdered build material. In the latter case, in a produced three-dimensional object, each "material" may correspond to a cured combination of the deposit-able agent and a powdered build material. In the former case, in a produced three-dimensional object, each "material" may correspond to a solidified portion of excreted or ejected polymer. In any case, each "material" is deposit-able by an additive manufacturing apparatus to generate a defined volume (e.g. at the production resolution) of an output three-dimensional object.

In this simple example, if the additive manufacturing apparatus is arranged to deposit discrete amounts of each material, e.g. in binary deposits, there are four different material combination states: a first state for the deposit of M1 without M2; a second state for the deposit of M2 without M1; a third state for the deposit of both M1 and M2, e.g. M2 deposited over M1 or vice versa; and a fourth state for an absence of both M1 and M2, e.g. "blank" (Z) or an inhibitor. In this case, the material volume coverage vector has four vector components: [M1, M2, M1M2, Z]. In the case of the last vector component, "blank" or "Z" may represent "empty" or an absence of materials in a processed layer, e.g. if agents are deposited on layers of build material this may denote an absence of build material for the processed layer, even though the build material may not be removed until the complete object has been produced.

This may be contrasted with a comparative method that associates material proportions to each voxel. In these comparative methods, a percentage of each of materials M1 and M2 are defined for each voxel, e.g. [M1, M2] wherein the vector is normalized to 1 (for ranges of 0-1) or 100% (for percentage ranges). In this comparative case, there is no consideration of the combination of M1 and M2, nor is there a consideration of the absence of both materials. As such these comparative methods do not consider material combinations; without considering the material combinations the defined material proportions cannot be linearly combined and exhibit non-linearities that make processing problematic. Additionally, the definition and use of material combinations provide more accurate and exact control of the materials that are used. For example, particular values for a given percentage of each of materials M1 and M2 as defined for a voxel, e.g. [M1=0.5, M2=0.5], may be controlled using a plurality for material volume coverage vector values, e.g. various combinations of M1, M2 and M1M2. Defining the absence of any material ("Z") as a particular material combination also further facilitates this control.

More generally, for an additive manufacturing apparatus having k available materials and L discrete deposit states for said materials, a material volume coverage vector comprises $L^k$ vector components, each vector component representing an available material/deposit state combination, including separate and joined use and an absence of any material. Or in other words, the vector components of a material volume coverage vector represent all materials available to an apparatus and their combinations, they are an enumeration of possible build or deposit states available to the apparatus. The vector components may be considered analogous to the concept of Neugebauer Primaries in color printing. In this analogy, each vector component may be considered to comprise a volume coverage of a "material primary". As such the material volume coverage vector has a dimensionality representative of these states and contains the volume coverages (e.g. probabilities) associated with each state. Or in other words, a material volume coverage vector (indicated in the Figures as MVoc) comprises weighted combinations or probabilities of material primaries. This compares to the comparative methods discussed above that have k vector components.

As can be seen, the present examples and the comparative methods rapidly diverge when a plurality of materials are available with a plurality of production build states; material volume coverage space is much greater than comparative material representation spaces. The vector components of a material volume coverage vector represent all materials available to an apparatus and their combinations. These materials may comprise, amongst others, any combination of: different build materials, different binders, different material property modifiers, different build powders, different agents, different epoxies and different inks. This provides another distinction when compared to comparative methods: any materials available to the apparatus may be included in the material volume coverage vector, e.g. this need not be limited to available colored build materials. In one case, depending on the implementation, the "available materials" may be a selected subset of materials, e.g. may comprise activated or deposit-able materials for a particular production run.

In one case, the object definition 140 may indicate one or more constituent parts of the three-dimensional object. For example, a "part" may comprise at least one volume of the three-dimensional object with certain object property values. This volume may be defined geometrical, e.g. by a number of vertices, and/or may be contained by a number of voxels. In one case, the volume may tagged with a sequence of bits (e.g. in the form of tuples) that indicate values of a set of pre-defined properties. For example, these properties may comprise, amongst others, any combination of the following properties: color, weight, density, stiffness, conductivity and opacity. A "part" may thus comprise defined volumes or volume elements with one or more properties, wherein a similarity measure between the property values is above a given threshold, e.g. clusters of one or more properties. In cases where the object definition 140 comprises data indicating a structure for each of a plurality of defined volumes, volumes with a common structure value may be considered a "part".

In the example of FIG. 1, the object processor 120 may be configured to: retrieve the object definition 140 as a file from a file system; comprise an application programming interface that is passed the object definition 140 and/or an address of data making up the object definition; and/or comprise a receiver arranged to receive the object definition 140 from a network device, e.g. a commutatively coupled computer configured to "print" the three-dimensional object via a print driver. In the last case the object definition 140 may comprise the result of processing by a print driver. In one case, the control data 150 may be stored, e.g. in a computer readable medium, to be accessed at a later point in time by a controller of an additive manufacturing system. In another case, the control data 150 may be passed to the additive manufacturing system, e.g. via a network or other communication coupling.

In one case, the set of structure forming components are configured to apply a halftone operation to the material volume coverage representation to generate a halftone output that is useable to generate discrete material arrangement instructions for an additive manufacturing system. Halftoning may be applied to either a set of original material volume coverage vectors or, in another case, a separately generated print-resolution material volume coverage representation that is produced from the original material volume coverage vectors. This may be the case where an object definition 140 is defined at a first resolution and an apparatus is arranged to arrange materials at a second resolution, wherein the first and second resolutions differ. In one case the first resolution may be higher than the second resolution.

Halftoning may be applied, for a particular part or portion of an object, layer-by-layer, e.g. on a per slice basis, or for the full three-dimensions of the part. The former case may comprise applying a threshold matrix per slice of the part, e.g. in two-dimensions, and the latter case may comprise applying a three-dimensional threshold matrix, e.g. an operation in three-dimensions for the part. A threshold matrix may comprise a dispersed-dot type pattern, such as whitenoise or blue-noise, or clustered-dot types, such as green-noise, AM-screen-like patterns, or others. In certain cases, error diffusion may be used instead of or as well as a threshold matrix. The result of the halftoning operation is control data comprising a set of instructions for the apparatus for production of the three-dimensional object. For example, if there are two available materials, M1 and M2, that may be deposited in a binary manner in a series of addressable locations in three-dimensions, the instructions may comprise voxels at the resolution of production and one of the array: [0, 0]—blank; [1, 0]—deposit M1; [0, 1]—deposit M2; and [1, 1]—deposit M1 and M2.

As described above, a part of an object may range from a single print-resolution voxel to a set of geometric shapes that are grouped together and have a single set of properties associated with them. As an example, a cube may be represented as a set of six tetrahedra. Three of the tetrahedra may be associated with a specified "SOLID" structure and three of the tetrahedra may be associated with a specified "LATTICE" structure. In this case, at each slice or z-plane, each volume element that is to be halftoned may contain a material volume coverage vector and an identifier that points to a specific one of a set of structure forming components, each structure forming component applying a different halftoning function. Each volume element is then halftoned using the appropriate structure forming component, and hence using an appropriate halftoning function. This may be performed on a volume-element by volume-element basis, wherein in certain cases a volume element may be taken to be a pixel of a given slice or z-plane having a depth equal to the depth of the given slice or z-plane. In the present cube example, the "SOLID" and "LATTICE" structures may be implemented using two different three-dimensional threshold matrices. In this case, a halftone threshold value for a given volume element may be retrieved from a corresponding volume element of one of the two different three-dimensional threshold matrices, e.g. as indicated by a structure identifier associated or derived for the given volume element.

In one case halftoning may comprise a thresholding operation whereby a value from a threshold matrix is compared against the probability distribution defined by a material volume coverage vector. For example, if a material volume coverage vector has three components each with values of 33%, a cumulative distribution may be generated with three intervals [0-33%, 33%-66%, 66%-100%]. In this case, if a threshold value from the threshold matrix has a value that falls within the first range [0-33%], then an instruction for deposit of the first material or material combination is output. Similarly, if a threshold value from the threshold matrix has a value that falls within the second range [33-66%], then an instruction for deposit of the second material or material combination is output and if a threshold value from the threshold matrix has a value that falls within the third range [66-100%], then an instruction for deposit of the third material or material combination is output. In this case the threshold matrix is configured to provide a uniform (although not regular) distribution of threshold values and as such over a particular area or volume 33% of the area or volume will have each of the three components.

Figure 2:
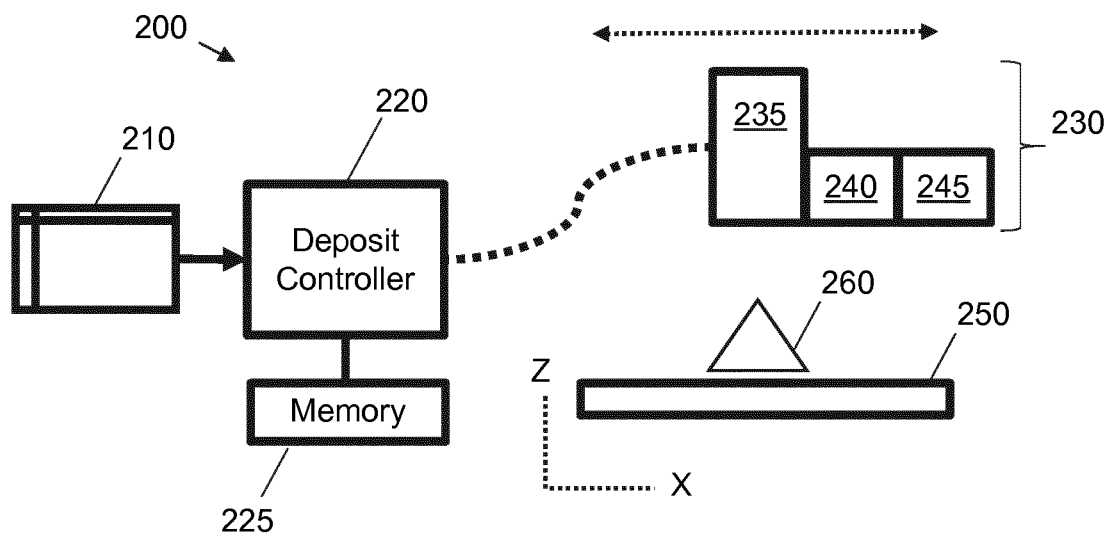
FIG. 2 is a schematic diagram showing an apparatus for production of a three-dimensional object according to an example.

FIG. 2 shows an example of an apparatus 200 arranged to produce a three-dimensional object 260. The apparatus 200 is arranged to receive data 210 for the three-dimensional object.

In FIG. 2, the apparatus 200 comprises a deposit controller 220 and a memory 225. The deposit controller 220 may comprise one or more processors that form part an embedded computing device, e.g. adapted for use in controlling an additive manufacturing system. Memory 225 may comprise volatile and/or non-volatile memory, e.g. a non-transitory storage medium, arranged to store computer program code, e.g. in the form of firmware. The deposit controller 220 is communicatively coupled to aspects of the apparatus that are arranged to construct the three dimensional object. These comprise a deposit mechanism 230. The deposit mechanism 230 is arranged to deposit the materials available for production of the three-dimensional object according to generated control data. In the present case, the deposit mechanism comprises a substrate supply mechanism 235 and an agent ejection mechanism 240, 245. In other cases the deposit mechanism 230 may comprise fewer or additional components, e.g. a substrate supply mechanism may be provided separately from the agent ejection mechanism or omitted, or other components, e.g. the deposit mechanism 230 may comprise a polymer extraction mechanism. In the schematic example of FIG. 2, the agent ejection mechanism 240, 245 comprise two components: a first component 240 for the supply of a first agent (e.g. material M1 as discussed above) and a second component 245 for the supply of a second agent (e.g. material M2 as discussed above). Two materials are presented in this example for ease of explanation but any number of materials may be supplied. Similar materials in the form of agents are described for example only. The substrate supply mechanism 235 is arranged to supply at least one substrate layer upon which the materials available for production are deposited by the agent ejection mechanism 240, 245 to produce the three-dimensional object 260. In the present case, the materials comprise agents that are applied to a powder substrate, wherein the combination of agent and powder, following a curing process, form part of the object. However, other implementations are possible, e.g. the materials may be deposited to form part of the object, e.g. as per the polymer case discussed above. In the example of FIG. 2, the three-dimensional object 260 is built layer by layer on a platen 250. The arrangement of the aspects and components shown in FIG. 2 are not limiting; the exact arrangement of each apparatus will vary according to the production technology that is implemented and the model of apparatus.

In the example of FIG. 2 the deposit controller 220 is configured to process and/or otherwise use the data 210 to control one or more components of the deposit mechanism 230. The deposit controller 220 may control one or more of the substrate supply mechanism 235 and the agent ejection mechanism 240, 245. For example, the discrete deposit instructions in the control data 150 may be used by the deposit controller 220 to control nozzles within the agent ejection mechanism. In one implementation the apparatus 200 may be arranged to use a coalescing agent and a coalescing modifier agent that are respectively supplied by the components of the agent ejection mechanism 240, 245. These agents allow a three-dimensional object to have varying material properties. They form part of the "materials" of the material volume coverage vector. They may be combined with one or more colored powdered substrate materials, e.g. applied using an inkjet mechanism to deposited powder layers, to generate multi-color objects with varying material properties. If a plurality of powdered substrate materials are available they may also form part of the "materials" of the material volume coverage vector in certain cases. In these cases the generated objects may be constructed by depositing at least the coalescing agent and the coalescing modifier agent on layers of substrate material, e.g. layers of powder or other material forming z-plane slices, followed by the application of energy to bind the material, e.g. infra-red or ultra-violet light. For example, one or more of the substrate supply mechanism 235 and the agent ejection mechanism 240, 245 may be moveable relative to the platen 250, e.g. in one or more of the x, y and z directions (wherein the y axis is into the sheet for FIG. 2). One or more of the substrate supply mechanism 235, the agent ejection mechanism 240, 245 and the platen 250 may be moveable under control of the deposit controller 220 to achieve this. Additionally, one or more inks may also be deposited on cured and/or uncured layers, wherein these inks also form part of the "materials" of the material volume coverage vector. In other implementations the apparatus may comprise part of, amongst others, selective laser sintering systems, stereo lithography systems, inkjet systems, fused deposition modelling systems, any three-dimensional printing system, inkjet deposition systems and laminated object manufacturing systems. These include apparatus that directly deposit materials rather than those described that use various agents.

In one case, the functionality of the production controller 130 and the deposit controller 220 may be combined in one embedded system that is arranged to receive the object definition 140, or data useable to produce the object definition 140, and control the apparatus 200. This may be the case for a "stand alone" apparatus that is arranged to receive data 210, e.g. by physical transfer and/or over a network, and produce an object accordingly. For example, this apparatus may be communicatively coupled to a computer device that is arranged to send a "print job" comprising the object definition 140, or data useable to produce the object definition 140, to the apparatus in the manner of a two-dimensional printer.

Figure 3:
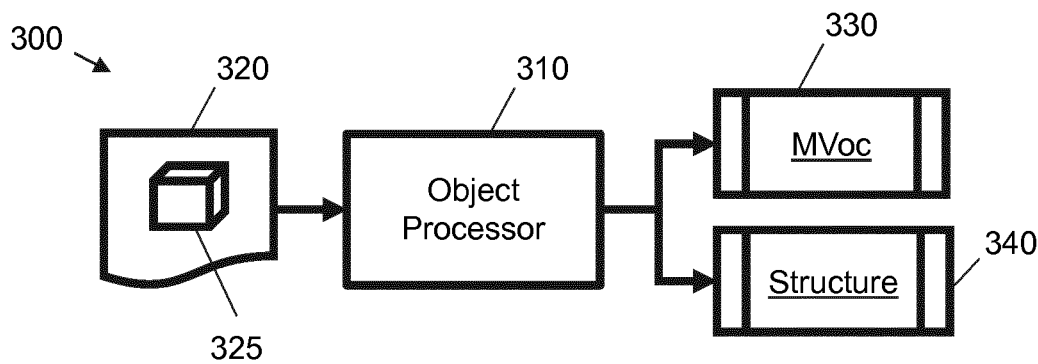
FIG. 3 is a schematic diagram showing an object processor according to an example.

FIG. 3 shows schematically an example 300 of an object processor 310 that may be used, in one implementation, with the apparatus 100 of FIG. 1 and/or the apparatus 200 of FIG. 2. The object processor 310 may implement the object processor 120 in one case. In the example 300, object data 320, which in this example comprises a vector representation 325, is received by the object processor 310. In other cases, the object processor 310 may alternatively be configured to receive a raster representation of the three-dimensional object. The object processor 310 processes the object data 320 to generate at least one material volume coverage (M-Vo-C or MVOC) vector 330 for one or more parts or portions of the three-dimensional object and an indication of the structure 340 of said parts or portions. In one case the parts or portions may be identified in the object data 320. In another case the object processor 310 may be arranged to segment the object data 320 into a plurality of parts or portions. This may be performed based on one or more of: defined color and defined object properties. The at least one material volume coverage vector 330 and indication of structure 340 for each part may form part of the object definition 140 that is provided to the object processor 120 as shown in FIG. 1, e.g. the object definition 140 may comprise data 330, 340 for all the parts of the object to be produced.

In one case, the object processor 310 may be arranged to convert three-dimensional object model data received in a vector-based format, e.g. data from a STereoLithography ".stl" file, to a predetermined raster resolution. Vector-based formats represent a three-dimensional object using defined model geometry, such as meshes of polygons and/or combinations of three-dimensional shape models. For example, a ".stl" file may comprise a vector representation in the form of a list of vertices in three dimensions, together with a surface tessellation in the form of a triangulation or association between three vertices. As discussed previously the raster representation may comprise a plurality of defined unit voxels or custom voxels, e.g. defined volumes of one or more sizes.

As an example, a three-dimensional object may have object property values indicating a particular color and density. These may be associated with color and density parameters than are defined for at least one volume or volume elements of a received object definition. In this case the object processor 310 maps the color and density values to a particular MVOC vector value and a particular structure tag or indication. The latter parameter may comprise a structure identifier, e.g. representing "STRUCTURE 1". In this case, to produce the three-dimensional object with the same color but a different density, a different indication of structure may be selected, in conjunction with the same (or a different depending on the mapping) MVOC vector value.

In certain cases, the object processor 310 may form part of an additional "up-stream" component to the object processor 120 in FIG. 1. In this case the object processor 120 is configured to receive the MVOC vector values 330 and the indication of structure 340, e.g. the object processor 120 in this case may be considered a data interface for the production controller 130. In another case, the function illustrated in FIG. 3 may form part of the function of apparatus 100. The exact configuration may depend on a selected implementation, e.g. the latter case may allow a "stand-alone" additive manufacturing system, whereas in the former case the object processor 310 may be implemented by an object design application and/or a print driver for a computer device communicatively coupled to the additive manufacturing system.

Figure 4:
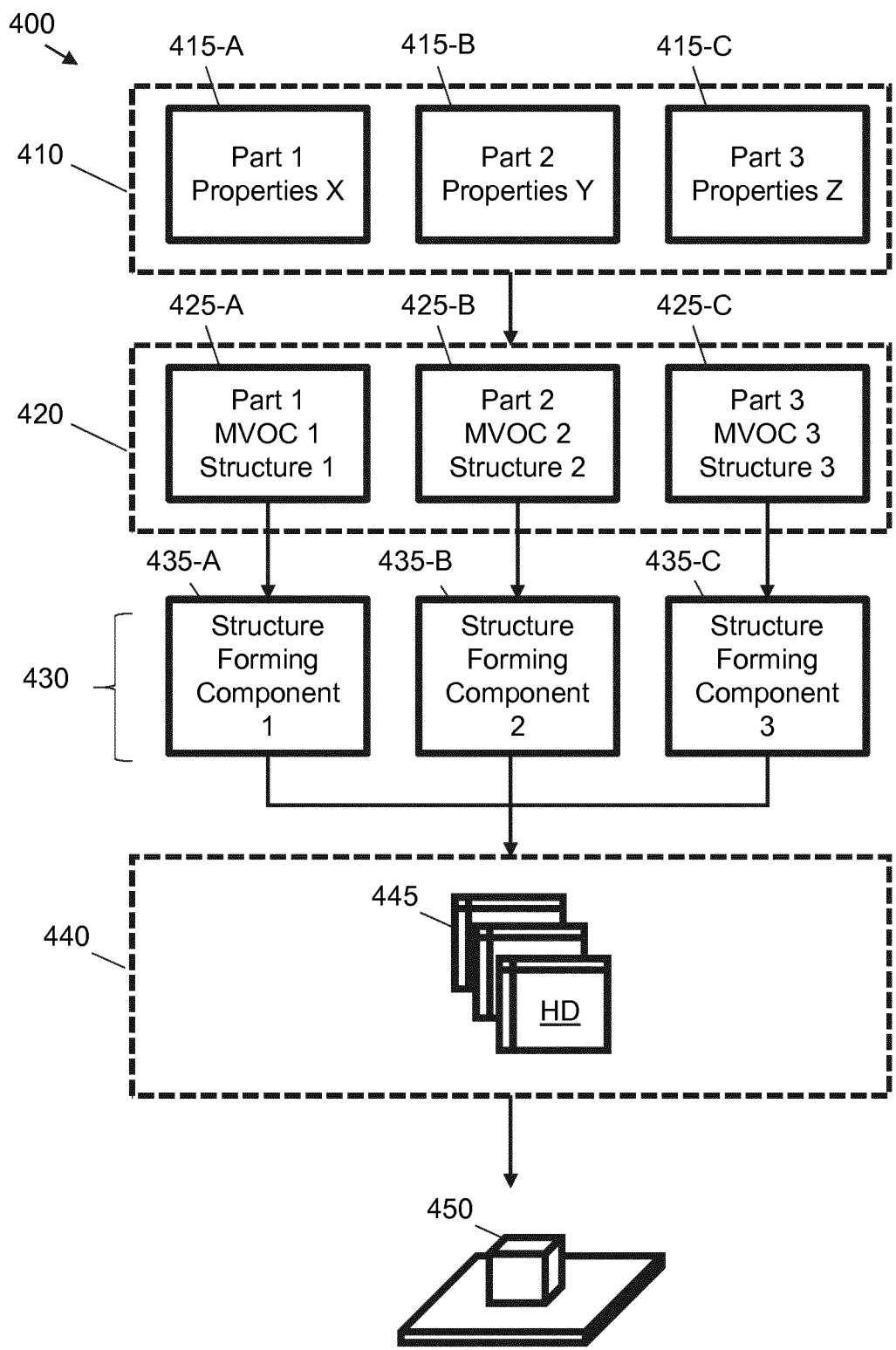
FIG. 4 is a schematic diagram showing a sequence of processing applied by an apparatus for generating control data for production of a three-dimensional object according to an example.

FIG. 4 shows a sequence 400 of processing applied by an apparatus for generating control data for production of a three-dimensional object according to an example. The sequence of processing may be applied by apparatus 110 or 200. The sequence 400 begins with a data 410 defining a three-dimensional object. This data 410 comprises a set of defined parts 415 of the three-dimensional object. In FIG. 4, three parts are shown: part 1 415-A; part 2 415-B; and part 3 415-C. These parts may comprise parts of a vector object model. Each part has an associated defined set of object properties, e.g. as described above. In FIG. 4, part 1 415-A has properties X; part 2 415-B has properties Y; and part 3 has properties Z.

In FIG. 4, the data 410 defining a three-dimensional object is then processed to generate an object definition 420 for the three dimensional object. The object definition 420 may comprise an example of object definition 140 in FIG. 1.

The object definition 420 may be generated by the object processor 310 of FIG. 3. In the present example, data for each of the parts 415 is processed to generate a part representation 425 comprising at least one material volume coverage (MVOC) vector for the part and an indication of structure for the part. The indication of structure for the part may be determined based on at least one object property for the part as defined in data 410. Alternatively, or additionally, an indication of structure may comprise one of the object properties defined in data 410. For example, in a first case, a mesh structure may be selected to obtain a desired weight or volume-to-surface ratio; in a second case, a mesh structure may be directly requested as one of the object properties, e.g. as a parameter value {OBJECT_STRUCTURE: "MESH"}.

Following the generation of the part representations 425, the object definition 420 is parsed to select a structure forming component 435 from a set of available structure forming components 430 for processing of each part representation 425. In FIG. 4, part 1 425-A has a structure indicated as "structure 1". This is mapped to structure forming component 1 435-A. Part 2 425-B has a structure indicated as "structure 2". This is mapped to structure forming component 2 435-B. Part 3 425-C has a structure indicated as "structure 3". This is mapped to structure forming component 3 435-C. The mapping of structure forming components to structure definitions may be performed by way of a look-up data structure, e.g. a table or an array loaded into memory. For example, structure "MESH" may be mapped to a mesh-forming material structure selection component, whereas structure "SOLID" may be mapped to a three-dimensional halftoning component. The set of available structure forming components 430 may comprise one or more: three-dimensional halftoning components; three-dimensional error-diffusion components; and material structure selection components. In general, each structure forming component is configured to distribute a material volume coverage vector in three-dimensional space. In one case, different structure forming components 430 may have specific associated resources. For example, different structure forming components 430 may have different parameters such as threshold matrices for three-dimensional halftoning components and error propagation kernels for three-dimensional error-diffusion components. These parameters, and their associated values, may determine the behavior of each different structure forming component 430. A material structure selection component may use a predefined mapping of at least one object property value to a particular halftone matrix. Hence, applying a material structure selection component may comprise retrieving and applying a particular two-dimensional or three-dimensional halftone matrix, e.g. to particular elements associated two-dimensional slices or three-dimensional volumes. In one case, the material structure selection component may select a particular halftone matrix based on a predefined look-up table that comprises object property values as an input and a matrix identifier as an output.

The output of each structure forming component 435 is halftone data 445 that may be combined to define a three-dimensional halftone output 440 for the three-dimensional object to be generated. The three-dimensional halftone output 440 may comprise data for use in instructing discrete deposit of materials available for production of the three-dimensional object at a production resolution. For example, in a system that uses three colored coalescing agents that are deposited on a base powdered substrate using a bi-level inkjet deposit mechanism (e.g. Cyan, Magenta and Yellow agents), the number of deposit states (L) equals 2 and the number of available materials (k) equals 3. In an additive manufacturing system wherein these agents are deposited on successive layers of powdered substrate, then a production resolution may comprise voxels having a depth (e.g. z-value) equal to the layer depth and a resolution in the plane of each layer (e.g. x and y values) equal to the two-dimensional ejection resolution of the deposit mechanism. In this case each structure forming component 435 is arranged to receive at least one material volume coverage vector comprising 8 vector components ($2^3$—such as [Z=0.5, C=0, M=0, Y=0, CM=0, CY=0.5, MY=0, CMY=0]) for a part or portion of the object and to generate a halftone output comprising one or more deposit instructions for the number of print voxels making up the part or portion (e.g. [C=0, M=0, Y=0], [C=1, M=0, Y=1] wherein a value of 1 indicates "deposit" the agent of the indicated color at a given x-y co-ordinate on a layer at a given z co-ordinate and a value of 0 indicated "do not deposit" at said addressable position). Hence, in this case, material volume coverage vector values in the form of probability values are mapped to control data comprising production instructions from a set of L*k available instruction values, wherein each element at the production resolution (e.g. each addressable voxel in three-dimensions) has one of L deposit state instructions for each of said k materials.

Figure 5:
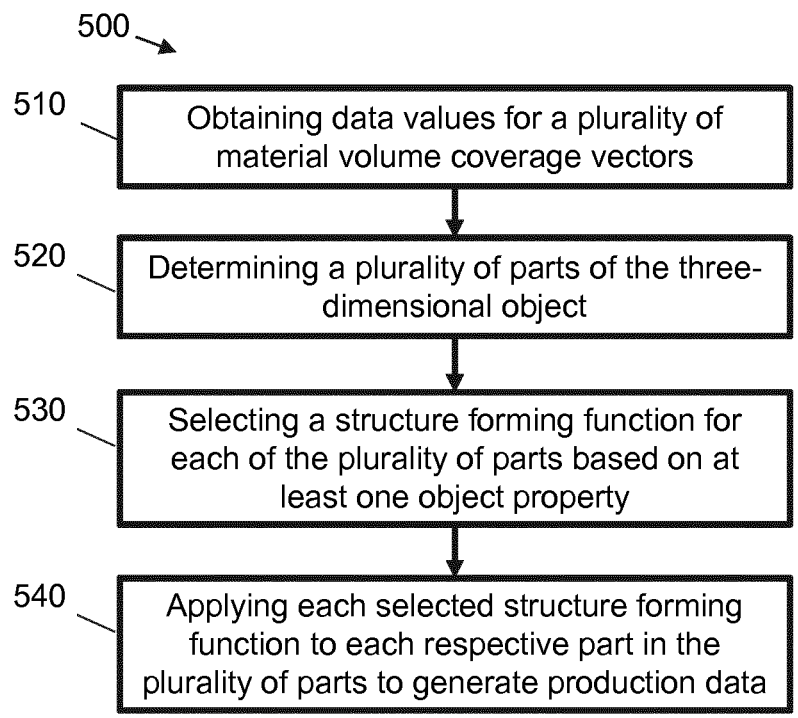
FIG. 5 is a flow diagram showing a method for generating production data for an apparatus according to an example.

FIG. 5 shows a method 500 for generating production data for an apparatus accordingly to an example. The apparatus may comprise an apparatus similar to that shown in FIG. 2 and/or the method 500 may be performed by the production controller 110, or another computer device, that is configured to process computer program code stored in memory. At block 510, data values for a plurality of material volume coverage vectors are obtained. These may form part of object definition 140 and the obtaining may comprise an action of the object processor 120, e.g. reading data from a file of a file system or receiving data over a communications channel. As described above, the material volume coverage vectors are defined with reference to a set of corresponding volume elements (e.g. unit or custom voxels), wherein the set of volume elements contain a representation of the three-dimensional object to be produced and each material volume coverage vector represents a probabilistic distribution, e.g. for a given volume element, of materials available to the apparatus for production of said object. At block 520, a plurality of parts of the three-dimensional object are determined. Data identifying parts may form part of an object definition, e.g. voxels may be tagged or otherwise associated with a part number or reference, or block 520 may comprise a segmentation procedure to determine the parts, e.g. based on one or more of defined color, material and object properties.

At block 530, a structure forming function for each of the plurality of parts is selected based on at least one object property. For example, each part may have an object property value defined either in relation to the part or its constituent volume elements. In certain cases, a plurality of values for an object property that are associated with an object part may be processed to determine a suitable structure and/or structure forming function. For example, an average object property value over a set of voxels forming the part may be mapped to a particular structure in a set of defined structures, and the structure may then be mapped to a structure forming component. In one case an indication of structure may be supplied as an object property, e.g. may be set at a design stage. In one case, such an indication of structure and one or more object property values may be processed to determine a structure forming function, e.g. "LATTICE" may be an indicated structure and a rigidity value may indicate a rigid object is suitable, thus a structure forming function suitable for lattices and rigid structures may be selected. In one case logic may be defined to map from indicated object property values to structure forming functions, e.g. using decision trees and/or probabilistic evaluation. The structure forming function may comprise one of: a three-dimensional halftoning function; a three-dimensional error-diffusion function; and a material structure selection function.

Each structure forming function is configured to output discrete material instruction values for volume elements at a production resolution. These may be at the same or at a different resolution from the volume elements of block 510. Each structure forming function may be implemented by an associated structure forming component, e.g. of the set 430 in FIG. 4. At block 540, each selected structure forming function is applied to each respective part in the plurality of parts to generate production data comprising material instruction values for at least a volume comprising the three-dimensional object to be produced. These material instructions are at the production resolution. The discrete material instructions may comprise instructions relating to the arrangement or deposit of discrete units of production material at defined locations in three-dimensions.

In one case, the output of block 540 is used to instruct a production mechanism of the apparatus to arrange the materials available to the apparatus at locations corresponding to the volume elements at the production resolution to produce the three-dimensional object. In one case, selecting a structure forming function comprises selecting computer program code configured to implement each structure forming function, loading said computer program code into memory, and executing said computer program code on at least one processor of a processing system to implement each structure forming function, including applying each structure forming function to data values for a plurality of material volume coverage vectors loaded into the memory to generate the production data in the memory. For example, this may be applied to memory forming part of production controller 130 or apparatus 200. In one case the method comprises obtaining a data file comprising data representative of a vector model of the three-dimensional object, e.g. object data 320, and processing the data file to generate said data values for the plurality of material volume coverage vectors. These blocks may be implemented by the object processor 310. In one case at least one object property, such as flexibility, stiffness, hardness, rigidity, conductivity or magnetism, may be mapped to a material volume coverage vector, e.g. proportional use of a given material may effect the desired object property.

Figure 6:
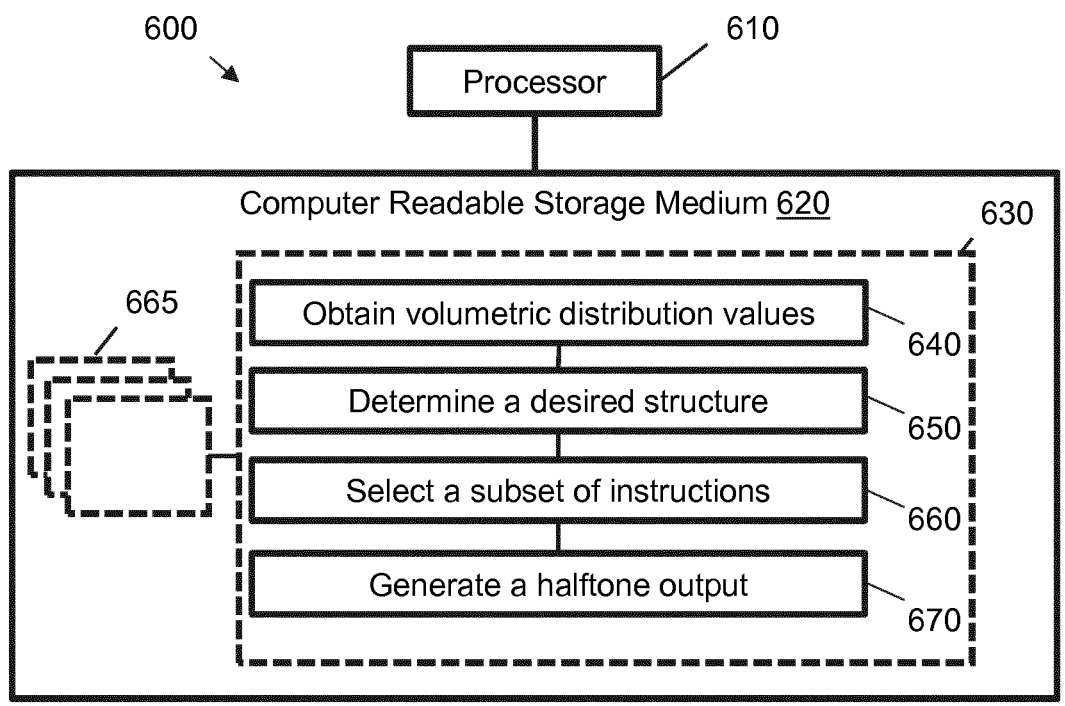
FIG. 6 is a schematic diagram showing a computing device according to an example.

Certain system components and methods described herein may be implemented by way of computer program code that is storable on a non-transitory storage medium. FIG. 6 shows an example 600 of a control system comprising at least one processor 610 arranged to retrieve data from a computer-readable storage medium 620. The control system may comprise part of an object production system such as an additive manufacturing system. The computer-readable storage medium 620 comprises a set of computer-readable instructions 630, 665 stored thereon. In certain cases instructions 630 and 665 may be stored on separate media. The at least one processor 610 is configured to load the instructions 630 into memory for processing. The instructions 630 are arranged to cause the at least one processor 610 to perform a series of actions. Instruction 640 is arranged to obtain volumetric distribution values for voxels associated with a defined portion of a three-dimensional object to be generated. In this case, each voxel has $L^k$ volumetric distribution values representative of different combinations of k materials accessible to the object production system, the object production system being configured to deposit L discrete quantities of said materials, each volumetric distribution value representing a proportion of a given one of the combinations for the voxel. Instruction 650 is configured to cause the processor 610 to determine a desired structure for the defined portion. Instruction 660 is configured to cause the processor 610 to select a subset of the set of computer-readable instructions 665 that are associated with the desired structure. Instruction 670 is configured to cause the processor 610 to execute the selected subset of computer-readable instructions in relation to the obtained volumetric distribution values to generate a halftone output for production voxels associated with the defined portion. In this case, the halftone output comprises, for each voxel of the production voxels, control data to instruct deposit of one of the L discrete quantities of at least one of the k materials accessible to the object production system.

The non-transitory storage medium can be any media that can contain, store, or maintain programs and data for use by or in connection with an instruction execution system. Machine-readable media can comprise any one of many physical media such as, for example, electronic, magnetic, optical, electromagnetic, or semiconductor media. More specific examples of suitable machine-readable media include, but are not limited to, a hard drive, a random access memory (RAM), a read-only memory (ROM), an erasable programmable read-only memory, or a portable disc.

In one case, the instructions 630 also comprise instructions to cause the processor to: obtain volumetric distribution values for voxels associated with a second defined portion of the three-dimensional object to be generated; determine a second desired structure for the second defined portion; select a further subset of the set of computer-readable instructions 665 that are associated with the second desired structure; execute the selected further subset of computer-readable instructions 665 in relation to the obtained volumetric distribution values to generate a halftone output for production voxels associated with the second defined portion; and collate both halftone outputs to generate control data for both defined portions of the three-dimensional object. In certain cases, the computer-readable instructions 630 cause the processor 610 to send the control data to a controller of the object production system to produce the three-dimensional object.

Certain examples described herein provide a volumetric representation of material combinations available to an apparatus. These materials may be inks, build materials, agents etc. For any unit volume, e.g. as defined by a voxel at a defined resolution, the probability distribution of materials within that volume are determined by the probability distribution as represented by a material volume coverage vector. Certain examples described herein further provide a modular structure forming pipeline that enables one or a plurality of different structure forming components or functions to be applied to a material volume coverage representation to determine the locations of each of the constituent materials during production using the apparatus, e.g. build instructions for an additive manufacturing system. The format of the material volume coverage representation enables any of a variety of approaches to be used, e.g. a structure forming method is not dependent on the form of the supplied object definition. Certain examples thus enable greater flexibility in controlling the output of an additive manufacturing system and allow a wider variety of obtainable object properties from a given system. Also the described examples mean that an additive manufacturing system is not constrained to a single spatial arrangement strategy, different strategies may be applied by simply changing the mapping of structure and/or object properties onto different structure forming components.

Certain examples described herein enable a three-dimensional object to be produced with a variety of structures. For example, constituent materials of an object may be arranged in one or more of: a connected, space-filling structure; a regular or irregular lattice; a three-dimensional checkerboard pattern; a randomly spaced structure; and a variety of defined spatial distributions. Control of structure based on input material volume coverage definitions may be applied for a complete object and/or for constituent parts of said object.

The preceding description has been presented to illustrate and describe examples of the principles described. This description is not intended to be exhaustive or to limit these principles to any precise form disclosed. Many modifications and variations are possible in light of the above teaching.

What is claimed is:

1. An apparatus arranged to generate control data for production of a three-dimensional object comprising:
an object processor to obtain an object definition, the object processor being configured to obtain a material volume coverage representation and an indication of structure for the three-dimensional object based on the object definition,
the material volume coverage representation comprising at least one material volume coverage vector for at least one volume of the three-dimensional object,
each material volume coverage vector representing a proportional volumetric coverage of materials available for production of the three-dimensional object and combinations of said materials,
the indication of structure indicating a structure for the at least one volume;
a production controller, communicatively coupled to the object processor, to generate control data for production of the three-dimensional object,
wherein the production controller is configured to:
select a structure forming component from a plurality of available structure forming components for the at least one volume based on the indication of structure for the at least one volume,
each structure forming component being configured to process at least a portion of the material volume coverage representation to generate a three-dimensional halftone output; and
apply the selected structure forming component to the material volume coverage representation and provide an output of the selected structure forming component as said control data, the control data comprising production instructions for discrete arrangement of said materials available for production of the three-dimensional object at a production resolution, wherein the control data defines voxels comprising multiple materials.

2. The apparatus according to claim 1,
wherein, for k materials available for production of the three-dimensional object and L discrete arrangement states for said materials, the material coverage vector comprises $L^k$ vector components, each vector component having an associated probability value, and wherein the control data comprises production instructions from a set of L*k available instruction values, each element at the production resolution having one of L arrangement state instructions for each of said k materials.

3. The apparatus according to claim 1, comprising:
a deposit mechanism, communicatively coupled to the production controller, to deposit the materials available for production of the three-dimensional object according to the generated control data, said discrete arrangement of the materials available for production comprising discrete deposit of said materials.

4. The apparatus according to claim 3, comprising:
a substrate supply mechanism, communicatively coupled to the production controller, to supply at least one substrate layer upon which the materials available for production are deposited by the deposit mechanism.

5. The apparatus according to claim 1, wherein the object processor is configured to:
obtain an object model for the three-dimensional object and at least one value for an object property;
process the object model to generate a raster representation of the three-dimensional object, the raster representation comprising a plurality of defined volumes containing the three-dimensional object;
for each defined volume within the plurality of defined volumes, determine values for a set of a vector components of a material volume coverage vector associated with the defined volume and an indication of structure for the defined volume based on the at least one value for the object property for the defined volume.

6. The apparatus according to claim 1, wherein the object definition comprises data defining the material volume coverage representation and the indication of structure for the three-dimensional object.

7. The apparatus according to claim 1, wherein the plurality of available structure forming components comprise:
a three-dimensional halftoning component;
a three-dimensional error-diffusion component; and
a material structure selection component.

8. The apparatus according to claim 1, wherein the control data comprises voxels comprising no deposited materials.

9. The apparatus according to claim 1, wherein the voxels are based on Delaunay tessellations.

10. The apparatus according to claim 1, wherein a material volume coverage representation is stored as a set of tuples.

11. A method for generating production data for an apparatus, the apparatus being arranged to produce a three-dimensional object, the method comprising:
obtaining data values for a plurality of material volume coverage vectors defined with reference to a set of corresponding volume elements,
the set of volume elements containing a representation of the three-dimensional object,
each material volume coverage vector representing a probabilistic distribution of materials available to the apparatus for production of the three-dimensional object;
determining a plurality of parts of the three-dimensional object;
selecting a structure forming function for each of the plurality of parts based on at least one object property associated with each of the plurality of parts,
each structure forming function being configured to output discrete material instruction values for volume elements at a production resolution; and
applying each selected structure forming function to each respective part in the plurality of parts to generate production data comprising material instruction values for at least a volume comprising the three-dimensional object to be produced at the production resolution wherein the volume comprising the three-dimensional object to be produced at the production resolution comprises multiple materials applied to a shared voxel.

12. The method of claim 11, comprising:
instructing, based on the production data, a deposit mechanism of the apparatus to deposit the materials available to the apparatus at locations corresponding to the volume elements at the production resolution to produce the three-dimensional object.

13. The method of claim 11, comprising:
obtaining a data file comprising data representative of a vector model of the three-dimensional object; and
processing the data file to generate said data values for the plurality of material volume coverage vectors.

14. The method of claim 11, comprising:
obtaining at least one value for an object property associated with the three-dimensional object; and
determining values for the object property for at least one volume element of each of said plurality of parts,
wherein selecting a structure forming function comprises selecting a structure forming function for each of the plurality of parts based on the determined values for the object property for the at least volume element of each of said plurality of parts.

15. The method of claim 11, wherein selecting a structure forming function comprises:
selecting computer program code configured to implement each structure forming function;
loading said computer program code into memory;
executing said computer program code on at least one processor of a processing system to implement each structure forming function, including applying each structure forming function to data values for a plurality of material volume coverage vectors loaded into the memory to generate the production data in the memory.

16. The method of claim 11, wherein the structure forming function comprises one of:
a three-dimensional halftoning function;
a three-dimensional error-diffusion function; and
a material structure selection function.

17. The method of claim 11, further comprising: printing the structure with a second set of material vectors.

18. A non-transitory computer-readable storage medium comprising a set of computer-readable instructions stored thereon, which, when executed by a processor of an object production system, cause the processor to:
obtain volumetric distribution values for voxels associated with a defined portion of a three-dimensional object to be generated,
each voxel having $L^k$ volumetric distribution values representative of different combinations of k materials accessible to the object production system,
the object production system being configured to deposit L discrete quantities of said materials,
each volumetric distribution value representing a proportion of a given one of the combinations for the voxel,
determine a desired structure for the defined portion;
select a subset of the set of computer-readable instructions that are associated with the desired structure; and execute the selected subset of computer-readable instructions in relation to the obtained volumetric distribution values to generate a halftone output for production voxels associated with the defined portion, the halftone output comprising, for each voxel of the production voxels, control data to instruct deposit of one of the L discrete quantities of at least one of the k materials accessible to the object production system.

19. The medium of claim 18, wherein the computer-readable instructions cause the processor to:

obtain volumetric distribution values for voxels associated with a second defined portion of the three-dimensional object to be generated, determine a second desired structure for the second defined portion;

select a further subset of the set of computer-readable instructions that are associated with the second desired structure;

execute the selected further subset of computer-readable instructions in relation to the obtained volumetric distribution values to generate a halftone output for production voxels associated with the second defined portion; and collate both halftone outputs to generate control data for both defined portions of the three-dimensional object.

20. The medium of claim 18, wherein the computer-readable instructions cause the processor to: deposit an inhibitor in a voxel.

* * * * *